(12) United States Patent
White et al.

(10) Patent No.: US 6,231,716 B1
(45) Date of Patent: May 15, 2001

(54) PROCESSING CHAMBER WITH RAPID WAFER EXCHANGE

(75) Inventors: Anthony White, Cupertino; Eugene Smargiassi, San Jose, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/188,872

(22) Filed: Nov. 9, 1998

(51) Int. Cl.[7] .............................. B65G 49/07; C23F 1/02; C23C 16/00
(52) U.S. Cl. .................. 156/345; 118/728; 118/500; 414/180; 414/609; 414/805; 414/814; 414/935; 414/937; 414/939; 187/250
(58) Field of Search .................. 118/728, 500; 156/345; 414/180, 609, 804, 805, 814, 935, 937, 939; 187/268, 267, 250, 276

(56) References Cited

U.S. PATENT DOCUMENTS

| | | | |
|---|---|---|---|
| 5,034,199 | * 7/1991 | Zavracky et al. | 422/245 |
| 5,612,850 | 3/1997 | Birang et al. | 361/234 |
| 5,677,824 | * 10/1997 | Harashima et al. | 361/234 |
| 5,695,568 | * 12/1997 | Sinha et al. | 118/729 |
| 5,848,670 | * 12/1998 | Salzman | 187/272 |
| 6,036,782 | * 3/2000 | Tanaka et al. | 118/715 |
| 6,068,441 | * 5/2000 | Raaijmakers et al. | 414/609 |
| 6,077,357 | * 6/2000 | Rossman et al. | 118/728 |

FOREIGN PATENT DOCUMENTS

| | | |
|---|---|---|
| 0 831 526 A2 | 3/1998 | (EP) . |
| 10135698 | 5/1998 | (JP) . |
| WO 99/63583 | 12/1999 | (WO) . |

* cited by examiner

Primary Examiner—Jeffrie R. Lund
(74) Attorney, Agent, or Firm—Pennie & Edmonds, LLP

(57) ABSTRACT

An apparatus for processing substrates includes a chamber, a substrate transfer element for transferring a substrate to and from the chamber, and a substrate support for receiving and holding a substrate within the chamber. The apparatus also includes multiple pins positioned and configured to be received by respective holes in the chamber bottom and moveable between a retracted position and an extended position. A pin actuation system is provided for moving the pins between the retracted position and the extended position. The pin actuation system controls the velocity at which the pins move and varies the speed of the pins by accelerating or decelerating at particular points during the pin cycle. A reduction in the cycle time is facilitated by accelerating the lift pins to relatively high speeds and then slowing the pins down prior to their arrival at locations where the substrate or wafer may be damaged. The throughput of the chamber can be increased, the likelihood of damage to the substrate can be reduced, and bouncing of the substrate while supported by the pins can be reduced.

23 Claims, 18 Drawing Sheets

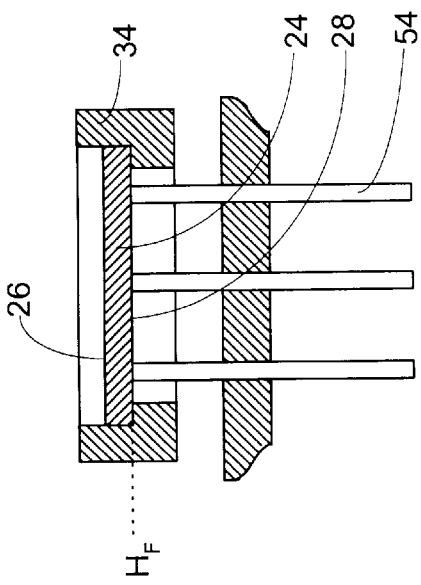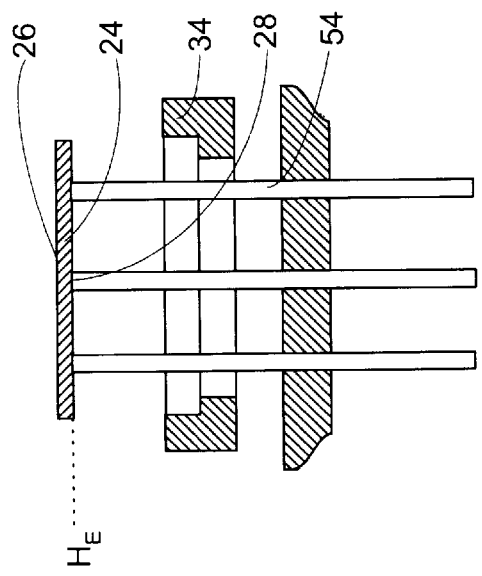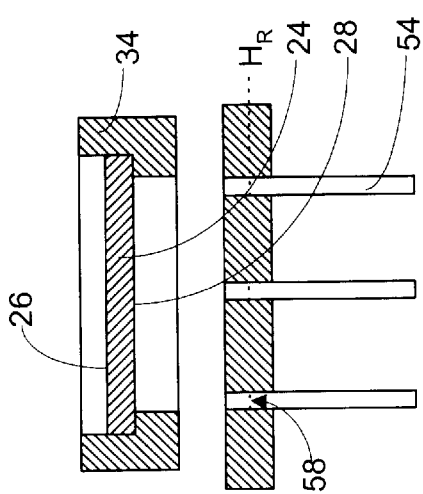

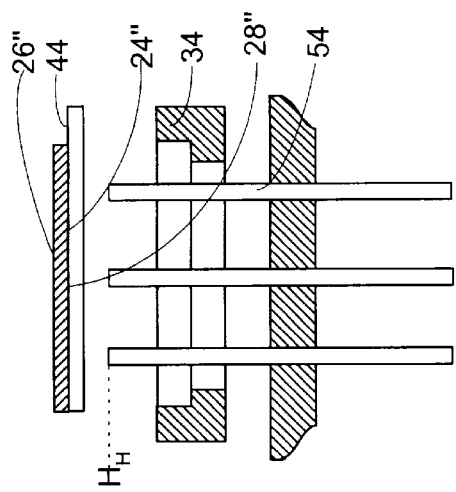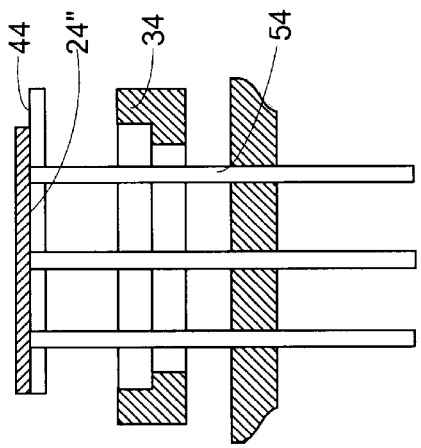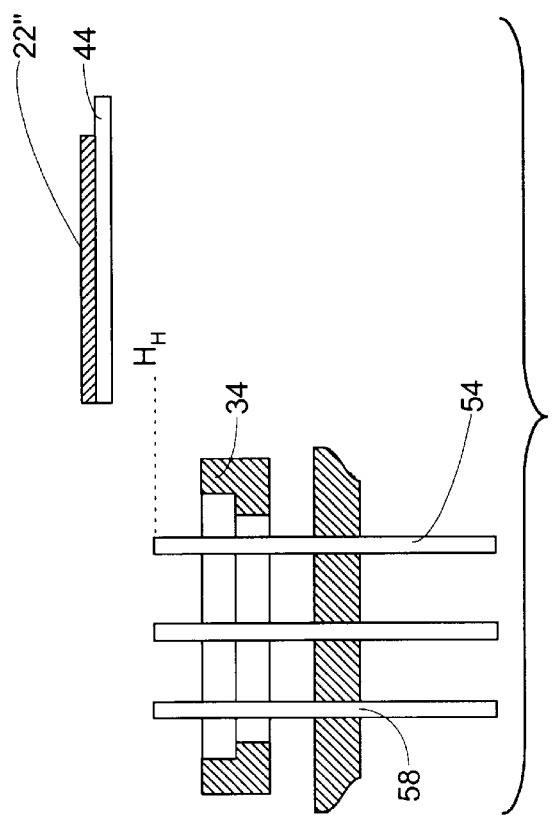

PROCESSING CHAMBER WITH RAPID WAFER EXCHANGE

BACKGROUND

The present invention relates to wafer or substrate processing chambers, and more particularly to the control of wafer lift pins in a rapid thermal processing (RTP) chamber used for processing semiconductor wafers or other substrates.

In the semiconductor processing field, various processing chambers are used to perform a variety of processes. These processes can include annealing, cleaning, chemical vapor deposition, oxidation, and nitridation. The processes may be applied under vacuum, under gas pressure and with the application of heat.

In one exemplary system for the thermal processing of semiconductor wafers, the wafer is carried by an edge ring which supports it. The wafer substrate is rotated so that the processes occur evenly over the wafer's surface. Loading and unloading of the wafer is automated. A number of lift pins are accommodated by holes or bores in the chamber bottom located below the wafer and edge ring. The lift pins are movable between retracted and extended positions. In the retracted position, the upper ends or tips of the pins are accommodated within the holes in the chamber bottom so as to be relatively shielded from the processes occurring in the chamber.

After a given wafer has been processed, the rotation of the wafer is stopped, and the lift pins are raised from the retracted position to the extended position. During transit from the retracted position to the extended position, the pins contact the lower surface of the wafer, lift it off the edge ring, and finally elevate it well above the edge ring. With the pins in the extended position, a transfer element can be inserted below the wafer. A typical transfer element is an end effector such as a fork or a blade of a robot external to the chamber. The end effector can be inserted into the chamber through a slit valve and is accommodated by the lift pins by being configured to either go around or between the lift pins. Once the end effector is below the wafer, the pins are lowered from the extended position to a retracted position. During the transit between the extended and retracted positions, the pins deposit the wafer on the end effector and then continue downward to the retracted position. The end effector then can be withdrawn from the chamber where it exchanges the wafer for a new one to be processed. The end effector carrying the second wafer then is inserted into the chamber. The pins are raised from the retracted position to the extended position. When the pins reach the level of the end effector, they contact the underside of the wafer and raise the wafer above the end effector until the pins reach the extended position. The end effector then is withdrawn and the pins again lowered from the extended position to the retracted position. When the pins reach the level of the edge ring, the edge ring contacts the underside of the wafer to acquire it from the pins. When the pins reach the retracted position, the edge ring is rotated, and the processing can be commenced. The time required to process each wafer, from its introduction to the chamber to the introduction of the next wafer, is designated the "cycle" time.

According to one exemplary system, the lift pins are driven pneumatically. The pins are coupled to the piston of a pneumatic cylinder. Upper and lower chambers above and below the piston are connected by an associated valve to atmosphere and to a compressed air source. The piston is raised by actuating the lower valve so that the lower chamber is connected to the compressed air source while actuating the upper valve so that the upper chamber is connected or vented to atmosphere. To lower the piston, the valve states are reversed.

For a given lift pin construction, the speed with which the pins move between the retracted and extended positions (the upstroke) and vice versa (the downstroke) is influenced by the pressure of the compressed air source (typically house compressed air at 60–80 pounds per square inch (psi)) and the particular throttling of the valves which can damp movement of the piston. Because of the throttling and other damping factors, the strokes occur at nearly constant velocity. Since the high cost of the chamber makes time-efficient use desirable, the valve throttling and other parameters should be selected to provide the fastest travel possible without damaging the wafer being handled.

The wafer can be damaged by impact of the pins if the pins move upward at an excessive speed. This can occur when the wafer is held either by the edge ring or by the end effector blade. Additionally, if the wafer and pins are moving downward at an excessive speed, the substrate may be damaged by contact with the blade or edge ring upon transfer. Also, if the pins are moving too quickly prior to reaching the upward extreme of their stroke, the wafer will continue moving upward after the pins have stopped and will then fall back down atop the pins and may be damaged. In one exemplary system, for example, the lift pin stroke is approximately 1.18 inches, and it takes approximately two seconds to get from the retracted to the extended position and vice versa.

Thus, it is desirable to facilitate a more efficient use of the chamber by reducing cycle time without unnecessarily risking damage to wafers.

SUMMARY

In general, according to one aspect, an apparatus for processing substrates includes a chamber, a substrate transfer element for transferring a substrate to and from the chamber, and a substrate support for receiving and holding a substrate within the chamber. The apparatus also includes multiple pins positioned and configured to be received by respective holes in the chamber bottom and moveable between a retracted position and an extended position.

A pin actuation system is provided for moving the pins between the retracted position and the extended position. The pin actuation system controls the velocity at which the pins move and varies the speed of the pins by accelerating or decelerating at particular points during the pin cycle. A reduction in the cycle time is facilitated by accelerating the lift pins to relatively high speeds and then slowing the pins down prior to their arrival at locations where the substrate or wafer may be damaged. Such locations or danger points include those in the following non-exhaustive list: (1) during a pin upstroke, the point at which the pins contact a wafer held by a substrate support such as an edge ring; (2) during a pin upstroke, the point at which the pins contact a wafer held by a transfer element such as a robot blade; (3) during a pin upstroke, the peak in pin travel when the pins carry a substrate from the substrate support; (4) during a pin upstroke, the peak in pin travel when the pins carry a substrate from the transfer element; (5) during a pin downstroke, the point at which a substrate held by the pins contacts the transfer element; and (6) during a pin downstroke, the point at which a substrate held by the pins contacts the substrate support.

Thus, according to one aspect, the pin actuation system is configured to bring the pins into engagement with a substrate held by the substrate support by (1) raising the pins from below the substrate at a velocity in a first upward velocity range and (2) then slowing the pins to a velocity in a second upward velocity range so that the pins contact a lower surface of the substrate while travelling at a velocity in the second upward velocity range, wherein the second upward velocity range is less than the first upward velocity range. The pin actuation system can further be configured to raise the substrate out of engagement with the substrate support to a height at which the substrate transfer element can be positioned beneath the substrate, by (1) raising the pins at a velocity in the first upward velocity range while the pins support the substrate; (2) subsequently slowing the velocity of the pins to a velocity in the second upward velocity range; and (3) bringing the pins to a stop at the height at which the substrate transfer element can be positioned beneath the substrate. The substrate then can be transferred to the transfer element by lowering the pins from the extended position.

According to another aspect, the pin actuation system is configured to transfer a substrate from the pins in their extended position to the substrate support by (1) lowering the pins at a velocity in a first downward velocity range, and (2) subsequently lowering the pins at a velocity in a second downward velocity range so that a lower surface of the substrate contacts the substrate support while travelling at the velocity in the second downward velocity range, wherein the second downward velocity range is less than the first downward velocity range. The pin actuation system can further be configured to lower the pins to the retracted position after the substrate has been transferred to the substrate support, wherein the pins are lowered to the retracted position at a velocity in the first downward velocity range. Additionally, the pin actuation system can be configured to cause the pins to acquire the substrate from the substrate transfer element by (1) raising the pins from a height beneath the substrate transfer element at a velocity in a first upward velocity range, and (2) then slowing the pins to a velocity in a second upward velocity range so that the pins contact the lower surface of the substrate while travelling at a velocity in the second upward velocity range, wherein the second upward velocity range is less than the first upward velocity range. Additionally, the substrate can be raised out of engagement with the substrate transfer element to a height at which the substrate transfer element can be withdrawn from beneath the substrate.

In various embodiments, the pin actuation system can be pneumatically-controlled. Alternatively, the pin actuation system can include a threaded rod, such as a lead screw, a stepper motor for driving the threaded rod, and a controller to control movement of the stepper motor. Further details of exemplary implementations of a pneumatically-controlled system and a motorized lead screw system are described below.

In some implementations, the first upward velocity range is at least about four times greater than the second upward velocity range. For example, in one particular implementation, the first upward velocity range is about 2.0 inches per second to about 4.0 inches per second, and the second upward velocity range is about 0.25 inches per second to about 0.5 inches per second. Similarly, in some implementations, the first downward velocity range is at least about four times greater than the second downward velocity range. For example, in one specific implementation, the first downward velocity range is about 2.0 inches per second to about 4.0 inches per second, and the second downward velocity range is about 0.25 inches per second to about 0.5 inches per second.

Methods of processing a substrate in a chamber also are disclosed and are described in greater detail below.

In various implementations, advantages of the invention include the capability of increasing the throughput of the chamber, reducing the likelihood of damage to the substrate, and reducing bouncing of the substrate while supported by the pins.

Other features and advantages of the invention will be apparent from the following description, drawings and claims.

BRIEF DESCRIPTION OF THE DRAWINGS

FIGS. 9–21 are partial cross-sectional views of the chamber of FIG. 1 in various stages of operation according to the pneumatically-controlled system.

FIGS. 24–35 are partial cross-sectional views of the chamber of FIG. 1 in various stages of operation according to the motorized lead screw system.

DETAILED DESCRIPTION

Figure 1:
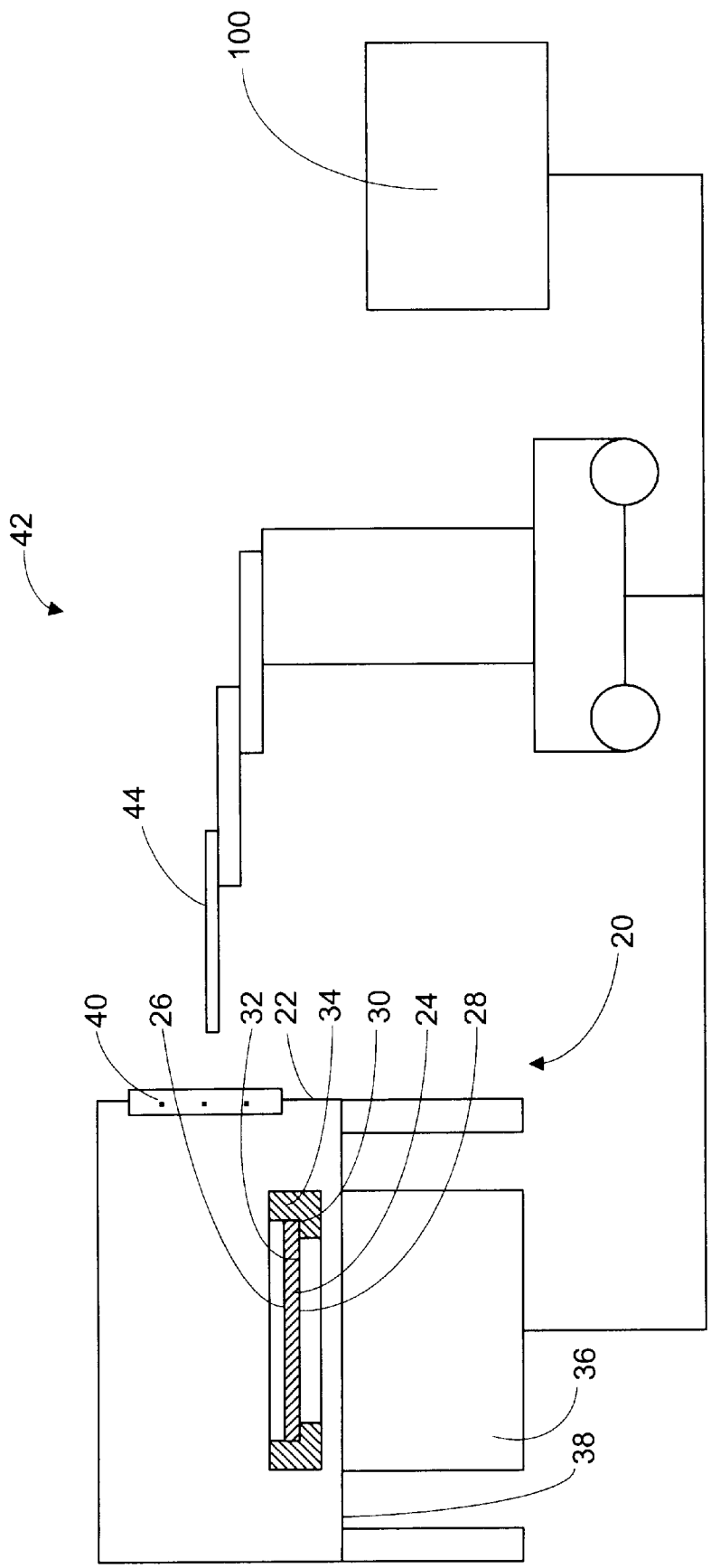
FIG. 1 is a schematic view of a wafer processing system according to the invention.

As shown in FIG. 1, a substrate or wafer processing system 20 includes a chamber 22 in which the processing occurs. In the interior of the chamber, a wafer 24 having an upper surface 26, a lower surface 28, and a perimeter 30, can be secured within a pocket 32 of an edge ring 34 or other substrate support. A wafer lift mechanism 36 depends from the chamber bottom 38. A slit valve 40 located in the chamber wall facilitates the introduction and removal of wafers to and from the chamber 22. A robot 42 with an end effector formed as a blade 44 at the distal end of the robot's arm facilitates the transfer of wafers.

Figure 2:
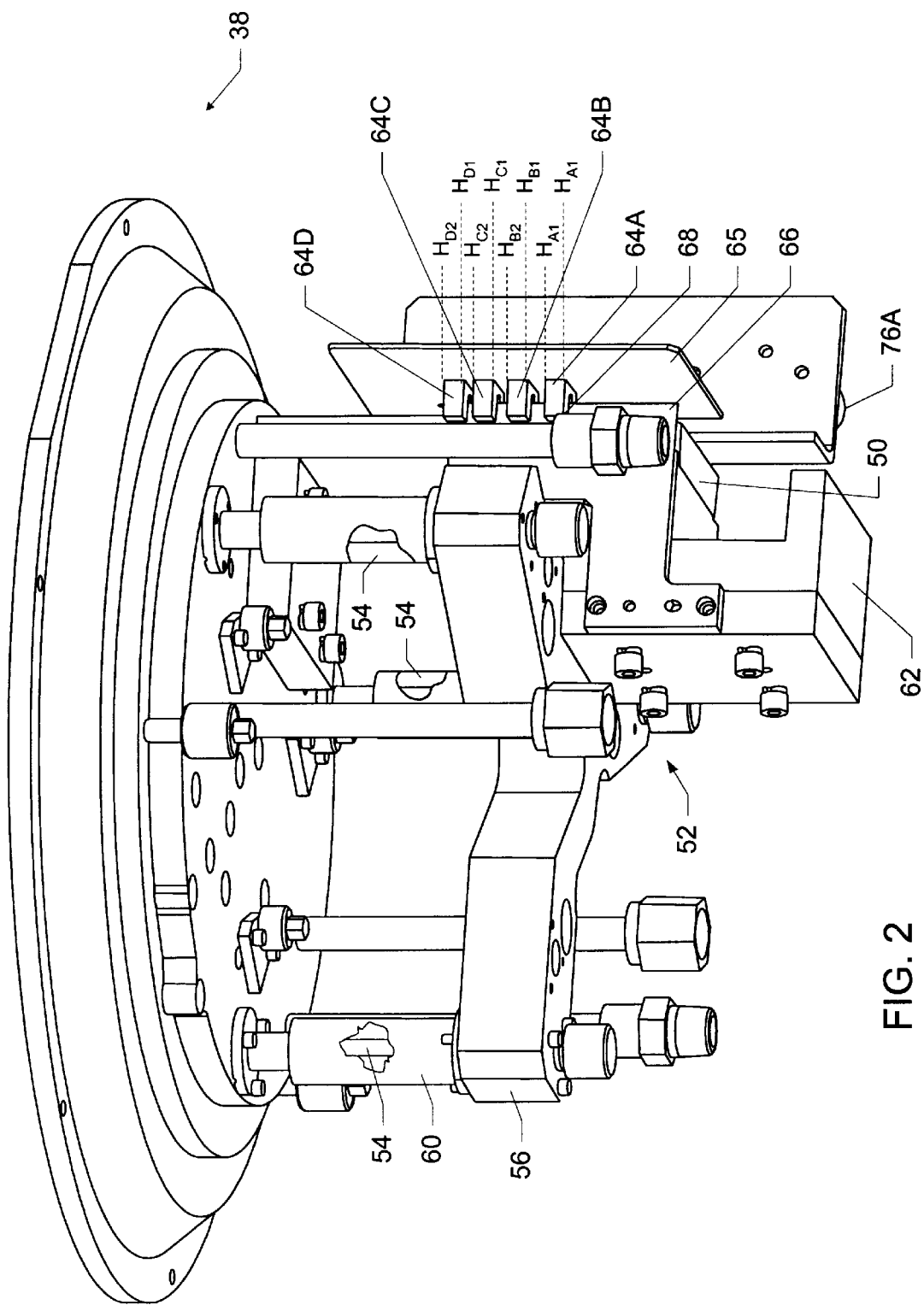
FIG. 2 is a partial view of a wafer lift system according to the invention.
Figure 3:
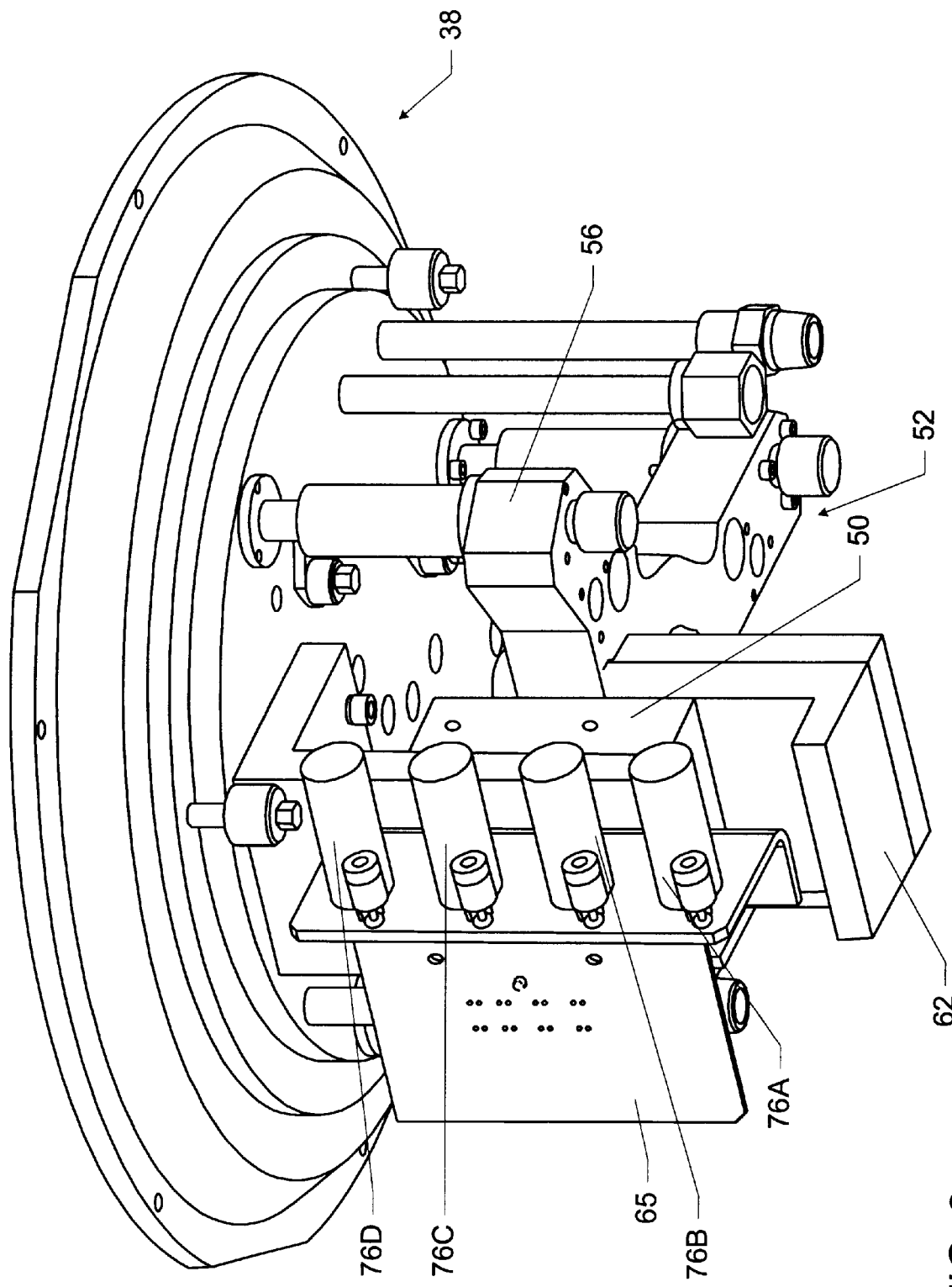
FIG. 3 is another view of the wafer lift system of FIG. 2.
Figure 4:
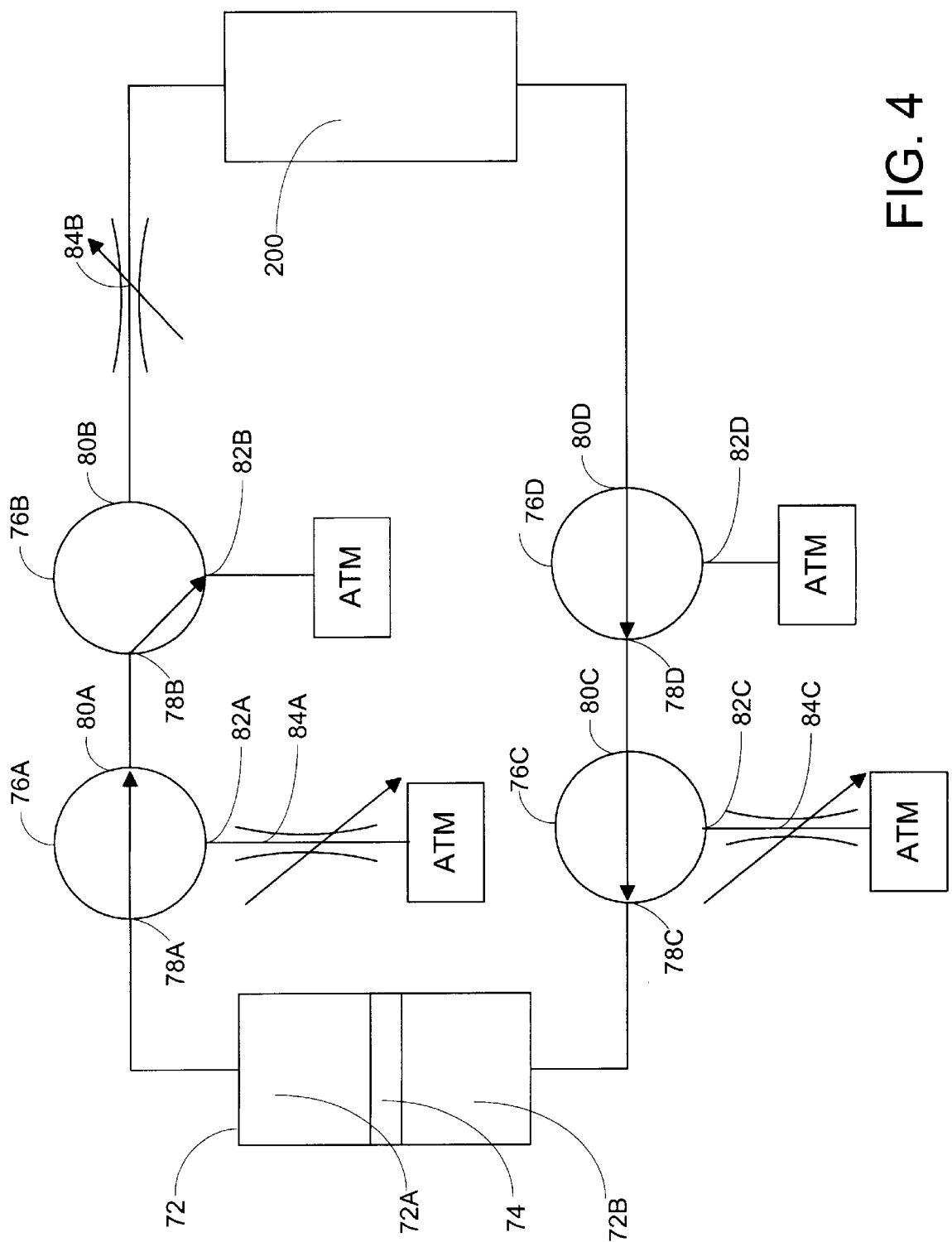
FIGS. 4–8 are schematic illustrations of a pneumatically-controlled substrate lift system according to the invention.
Figure 5:
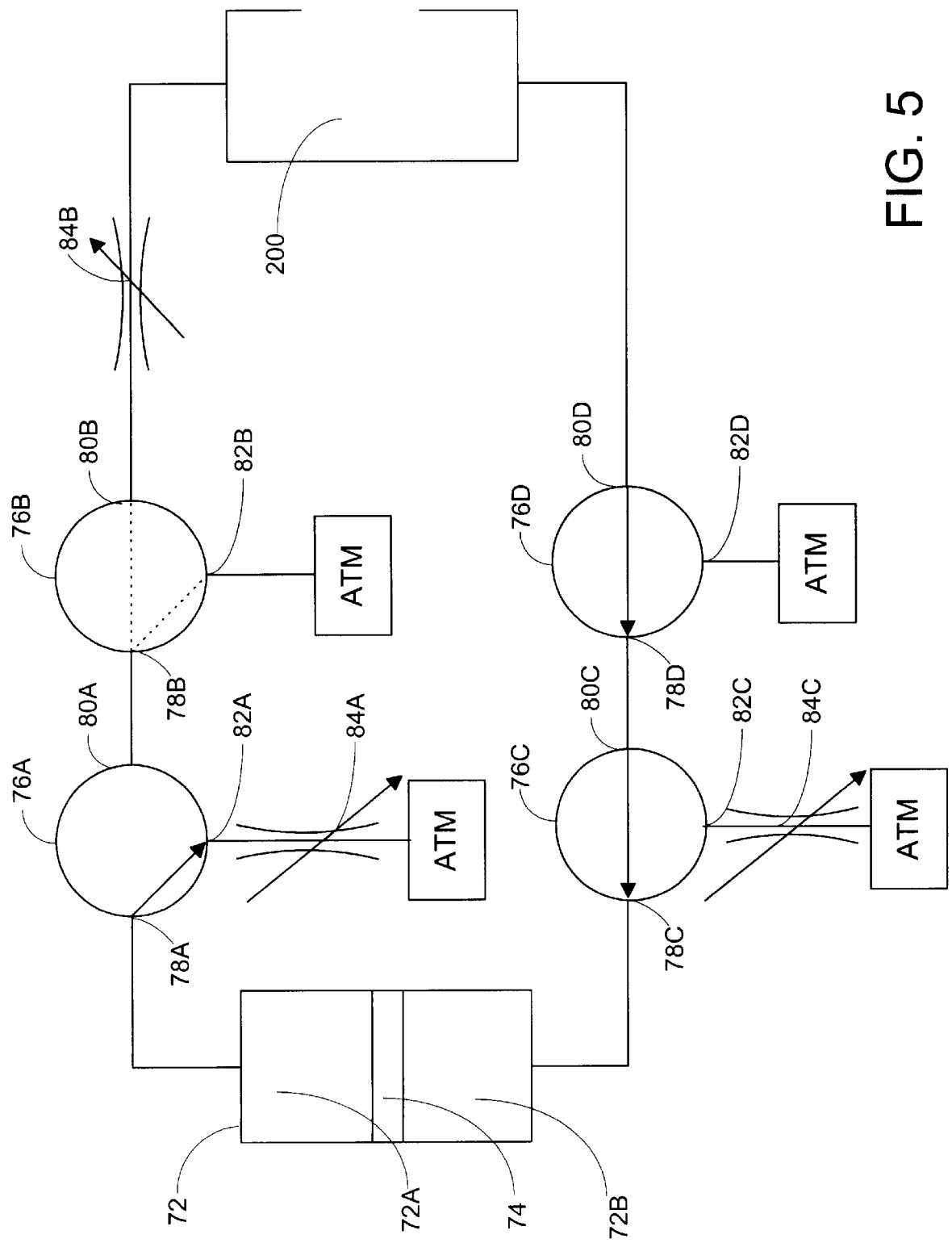
Figure 6:
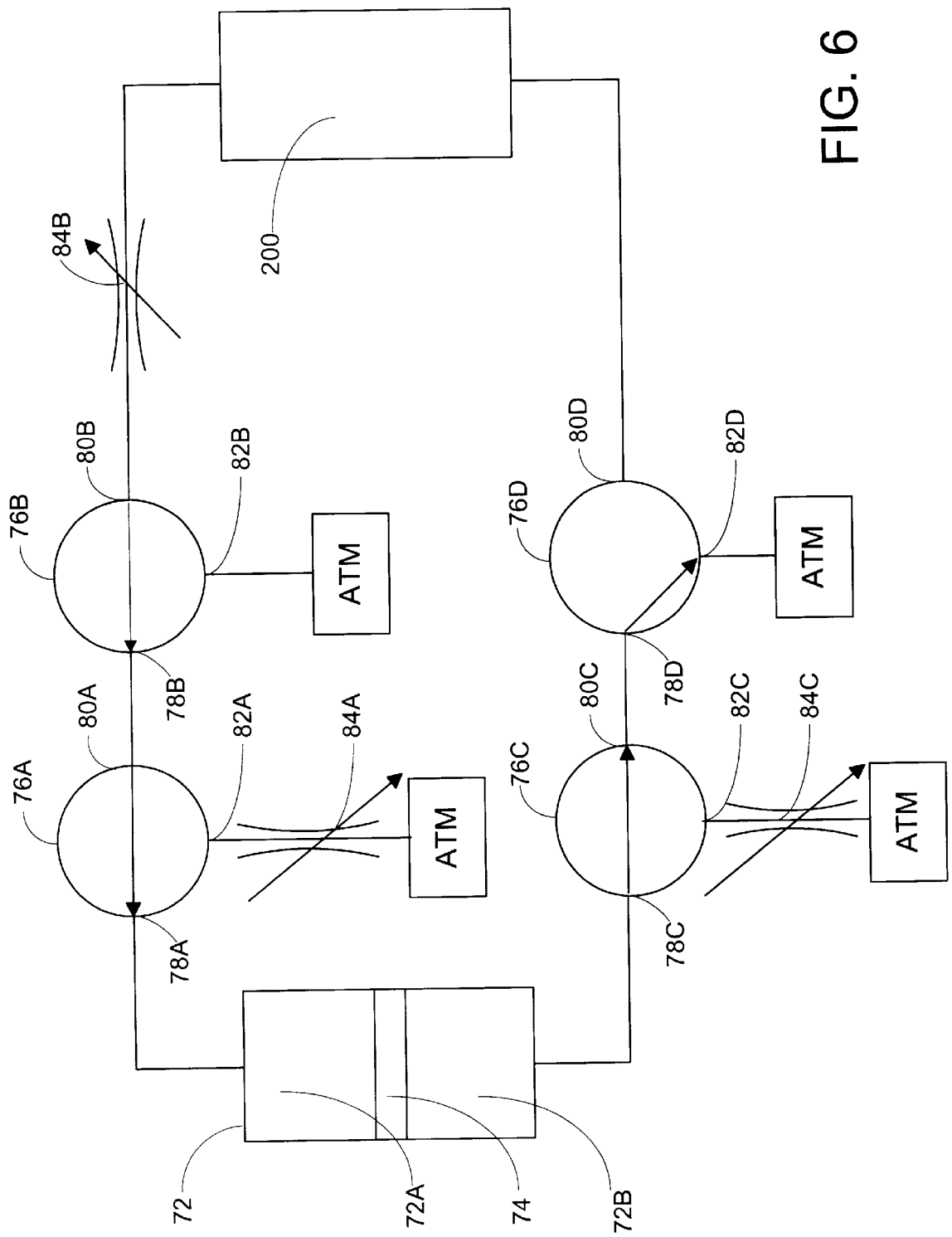
Figure 7:
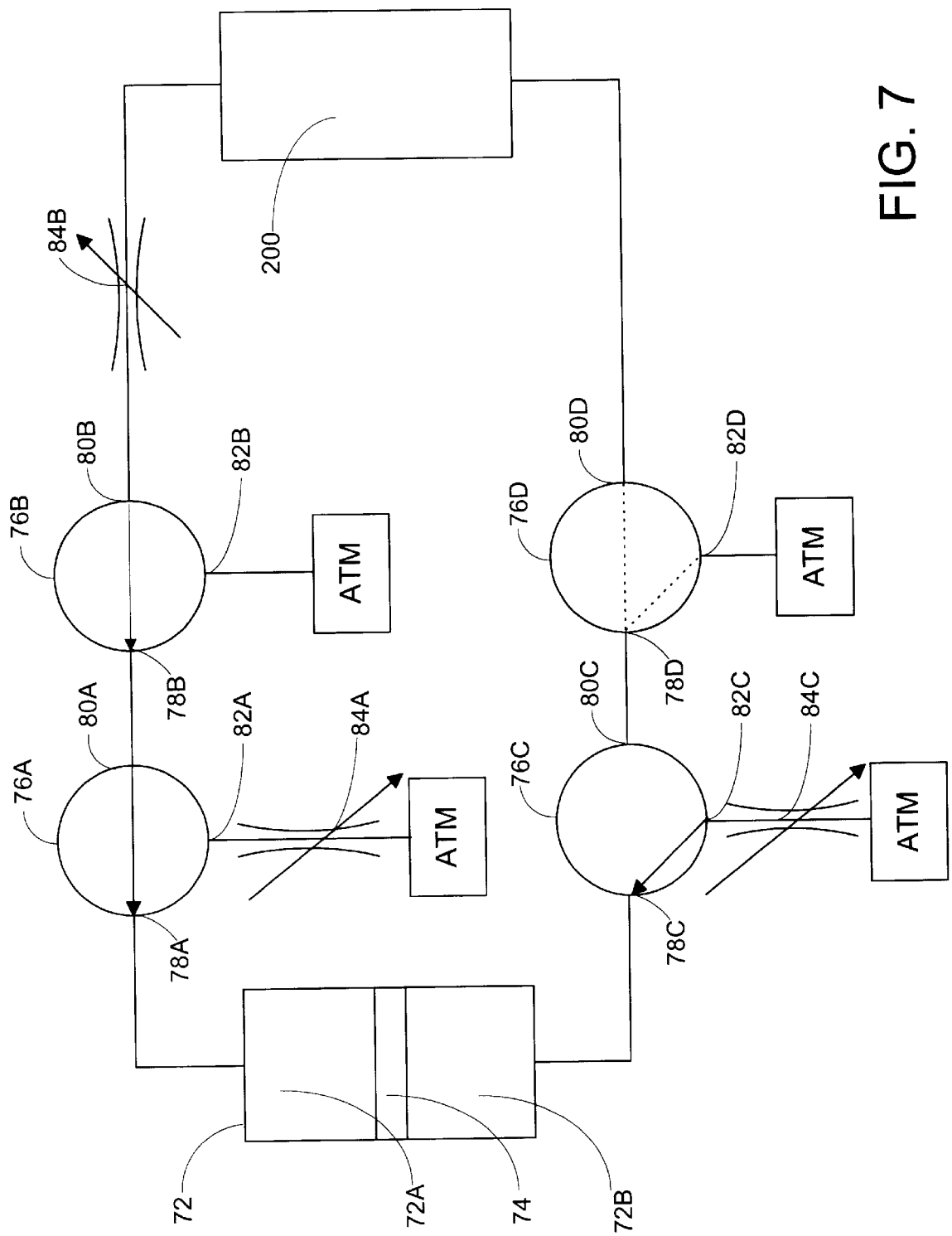
Figure 8:
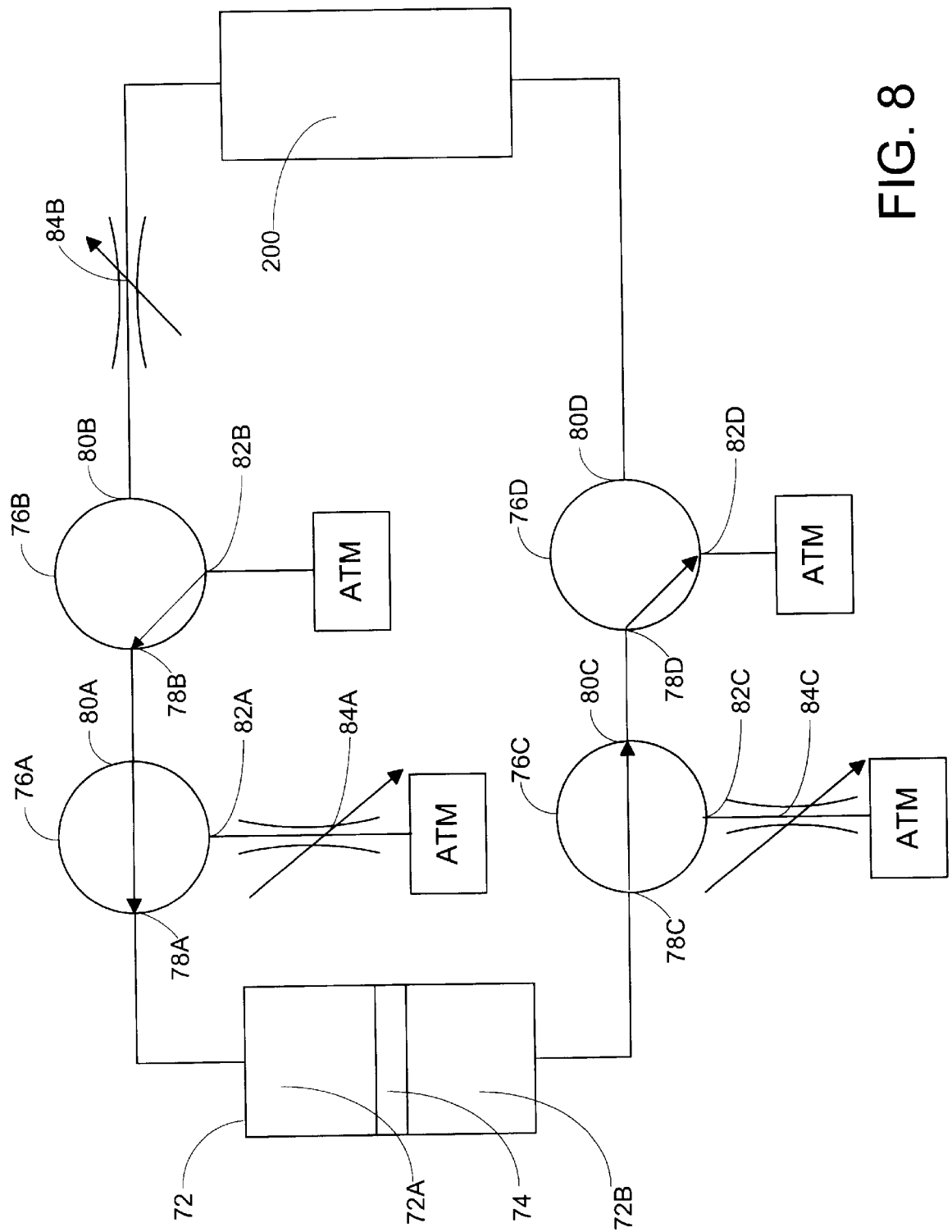

As shown in FIG. 2, the wafer lifting system includes a fixed portion 50 secured to the chamber bottom 38. A movable portion 52 is coupled to the fixed portion to permit vertical reciprocation. The movable portion 52 includes three lift pins 54 on an elevator or "spider plate" 56. The lift pins extend into and are received by holes 58 in the chamber bottom (see, e.g., FIG. 9). To maintain a leak tight or vacuum condition, each pin 54 is carried within a bellows 60 (FIG. 2) sealed to the chamber bottom and to the elevator 56. The movable portion 52 can be raised between a retracted position to an ex25 tended position as described in further detail below.

The fixed portion 50 includes a vertically oriented array of sensors 64A, 64B, 64C and 64D, mounted on a printed circuit board 65. Each sensor 64A, 64B, 64C, 64D includes a photoemitter and a detector for detecting light emitted by the respective photoemitter. A vertically oriented plate 66 is fixed to the movable portion 52 and positioned between the photoemitter and the detector of each sensor 64A, 64B, 64C, 64D. The plate bears a vertically elongated triggering aperture or slit 68 located to pass sequentially between the photoemitter and detector of each sensor 64A, 64B, 64C, 64D during vertical movement of the portion 52.

When the aperture 68 is aligned with a sensor 64A–64D, the aperture permits transmission of light from the photoemitter of the sensor to the detector associated with that sensor. This transmission places the sensor in a positive state and causes the sensor to supply a specific input signal to a control system 100 (FIG. 1). The control system 100 can be a computer programmed with appropriate control software and coupled to the chamber 22 and robot 42 to control their respective operations. When no light is transmitted between the photoemitter and detector of a given sensor, the sensor is in a negative state and the specific signal is not present. The aperture 68 need not be exactly aligned with a sensor for the sensor to be in a positive state. A range of aperture positions are associated with each sensor and permit the transmission of sufficient light to place the sensor in the positive state. The aperture positions are associated with a range of heights of the pins, or, more precisely, the tips of the pins. The range of pin heights extends between a lower height $H_1$ and an upper height $H_2$ which correspond, respectively, to lower and upper aperture positions. The difference between these heights will depend upon the length of the aperture and the properties of the sensor. Thus, there exist respective pairs of heights $H_{A1}$ and $H_{A2}$; $H_{B1}$ and $H_{B2}$; $H_{C1}$ and $H_{C2}$; and $H_{D1}$ and $H_{D2}$ for sensors 64A, 64B, 64C, 64D (see FIG. 2). The change in a sensor's state caused by the lifting system moving the pins through any of these heights can be used to control the speed at which the lifting pins 54 are moved.

In any given implementation, fewer or more sensors can be provided and can be utilized in different combinations to initiate and terminate various stages in the operation of the lift system 36. For example, a single encoder. can be used with its output summed to provide position data or otherwise processed to provide position or velocity data.

The portion 52 of the wafer lifting system 36 is moved relative to the fixed portion 50 by means of a slide 62 which, according to one embodiment, is controlled pneumatically. In the pneumatically controlled emodiment, the fixed portion 50 includes a pneumatic cylinder 72 (FIGS. 4–8). A piston 74 within the pneumatic cylinder 72 is linked to the movable portion 52 so that vertical movement of the piston 74 produces an associated vertical movement of the movable portion 52. The piston 74 divides the pneumatic cylinder 72 into an upper chamber 72A and a lower chamber 72B. A group of four 3-way direct control valves 76A, 76B, 76C, 76D establishes selective communication between the cylinder chambers 72A and 72B on the one hand, and a pneumatic source 200 and the atmosphere (ATM) on the other hand. Exemplary valves can be direct-acting solenoid valves such as those available from Precision Dynamics, Inc., New Britain, Conn. Each valve 76A through 76D has a respective primary port 78A, 78B, 78C, 78D, a normally closed port 80A, 80B, 80C, 80D, and a normally open port 82A, 82B, 82C, 82D. When a valve is in an unenergized state, communication is between the primary port and the normally open port. When the valve is in an energized state, communication is between the primary port and the normally closed port. Optionally, some of the normally closed and normally open ports can have a throttle 84 for further restricting flow through the associated port. The setting of each throttle can be used to affect the speed at which the portion 52 moves. An exemplary throttle can be provided by a speed controller such as Series AS of SMC Pneumatics Inc.

In a first mode of operation (FIG. 4) referred to as an "up fast" mode, the valve 76B is not energized and the remaining valves are energized. Accordingly, the lower cylinder chamber 72B is exposed to the pneumatic source 200 through the valves 76C and 76D in series. The upper cylinder chamber 72A is vented to atmosphere through the valves 76A and 76B in series. When operated in the first mode, the pins 54 move upward at a velocity in a first velocity range.

In a second mode (FIG. 5) designated the "up slow" 10 mode, flow is restricted compared to flow in the "up fast" mode. The valve 76A is de-energizing so that the upper cylinder chamber 72A communicates with the atmosphere through the valve 76A and a throttle 84A in series. The valves 76C and 76D remain energized, and the state of the valve 76B is irrelevant. When operated in the second mode, the pins 54 move upward at a velocity in a second upward velocity range lower than the first upward velocity range.

In a third or "down fast" mode (FIG. 6), the valves 76A, 76B, 76C are energized while the valve 76D is de-energized. The lower cylinder chamber 72B communicates with the atmosphere through the valves 76C and 76D in series. The upper cylinder chamber 72A communicates with the source 200 via the valves 76A and 76B and, optionally, a throttle 84B in series. The throttle 84B can be provided to compensate for acceleration of the movable portion 52 due to gravity. When operated in the third mode, the pins 54 move downward at a velocity in a first downward velocity range.

In a fourth or "down slow" mode (FIG. 7), the upper cylinder chamber is exposed to the source 200 as in the "down fast" mode. The valve 76C is de-energized so that the lower cylinder 72B communicates with the atmosphere via the valve 76C and a throttle 84C. The state of the valve 76D is immaterial. When operated in the fourth mode, the pins 54 move downward at a velocity in a second downward velocity range lower than the first downward velocity range.

In a fifth or "down unpowered" mode (FIG. 8), both the upper and lower cylinder chambers 72A and 72B are vented to atmosphere through the pairs of valves 76A, 76B, 76C, 76D, respectively. In this mode, acceleration is caused by gravitational acceleration along with any stored energy such as from compression of the bellows 60.

In the following description, it is convenient to refer to various pin positions as follows. A fully retracted pin height ($H_R$) is defined as a zero or reference height. In the fully retracted position $H_R$, the upper ends of the pins 54 are accommodated within the holes in the chamber bottom so as to be shielded from the processes occurring in the chamber. In addition, $H_F$ is the height at which the pins engage a wafer held by the fixture or edge ring, $H_T$ is the height at which the pins engage a wafer held by the blade or other transfer element, and the fully extended height is $H_E$.

Initially, the lift pins 54 may be in a retracted position at the reference height $H_R$ within the chamber bottom (FIG. 9). The wafer 24 is supported by the edge ring 34. A process has been performed on the wafer, and the wafer must be exchanged for a fresh wafer. In a first stroke, the pins 54 are raised beyond the position shown in FIG. 10 wherein the pins 54 initially engage the lower surface 28 of the wafer 24 at height $H_F$. In a first stage of movement, the lifting system 36 raises the pins 54 in the up fast mode. During this stage, the aperture 68 permits light to pass between the photoemitter and detector of the lowermost sensor 64A only. Eventually, the pins 54 reach the intermediate height $H_{B1}$ at which the aperture 68 permits light to pass between the photoemitter and detector of the lower middle sensor 64B. The transmission of such light produces a signal from the sensor 64B to the control system 100 causing the lifting system to be switched to the up slow mode during a second stage of movement. During the second stage, the pins 54 pass through the position shown in FIG. 10 at the reduced speed to acquire the wafer 24 from the edge ring 34. Shortly thereafter, when the pins 54 reach the intermediate height $H_{B2}$, the aperture 68 passes beyond the sensor 64B, no longer permitting the transmission of light between the photoemitter and detector of that sensor and terminating the input signal from that sensor. The termination of the input signal provided by the sensor 64B to the control system 100, causes the control system to return the lifting system to the up fast mode during a third stage of movement.

Figure 12:
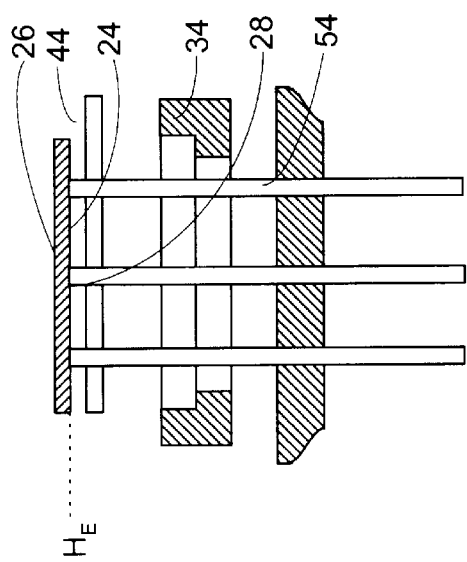

Prior to reaching the fully extended position or the peak in their travel at height $H_E$, the pins 54 reach the intermediate height $H_{D1}$ at which the aperture 68 first permits the transmission of light between the photoemitter and detector of the uppermost sensor 64D to produce an input signal from that sensor to the control system 100. The input from the uppermost sensor 640 causes the control system to return the lifting system to the up slow mode in a fourth stage of movement during the upstroke. This return to the up slow mode reduces any upward propulsion of the wafer when the pins reach their extended position at height $H_E$ (FIG. 11). With the pins 54 in the extended position, the blade 44 can be inserted below the wafer (FIG. 12).

Figure 13:
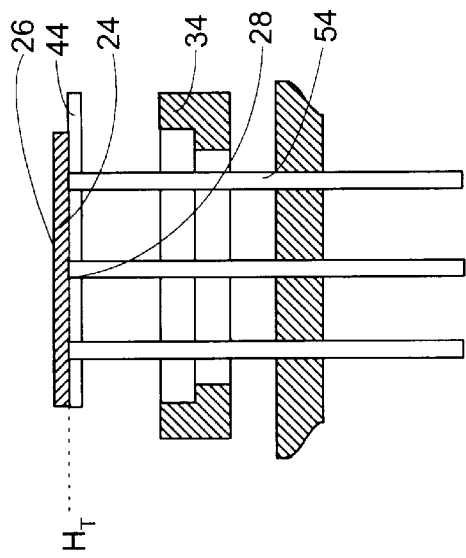
Figure 14:
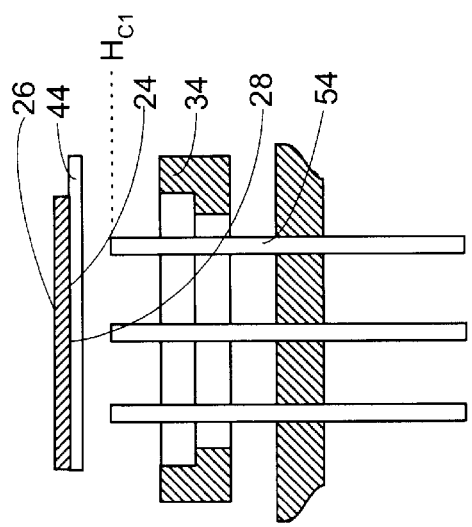
Figure 15:
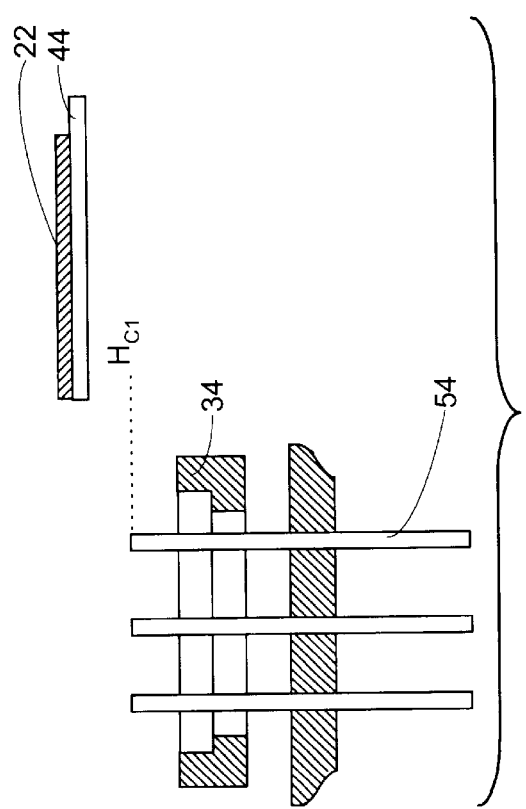

With the blade 44 in place beneath the wafer, the control system 100 initiates a downstroke of the lifting system. In a first stage of the downstroke, the lifting system is placed in the down unpowered mode. In that first stage, the pins 54 descend, depositing the wafer on the blade 44 at height $H_T$ (FIG. 13). After depositing the wafer on the blade 44, the wafer lifting system and the pins 54 reach a height $H_{C2}$ at which the aperture 68 permits light to pass between the photoemitter and detector of the upper middle sensor 64C. The transmission of the light produces a signal from the sensor 64C to the control system 100 causing the lifting system to be switched to the down fast mode in a second stage. Shortly thereafter, the aperture 68 passes beyond the sensor 64C with the pins at height $H_{C1}$ (FIG. 14). Light no longer passes between the photoemitter and the detector, and the input signal from the sensor 64C is terminated. Termination of the input signal causes the control system 100 to withdraw the robot end effector 44 and wafer from the chamber (FIG. 15), whereupon the wafer can be exchanged for a second, fresh wafer.

Figure 16:
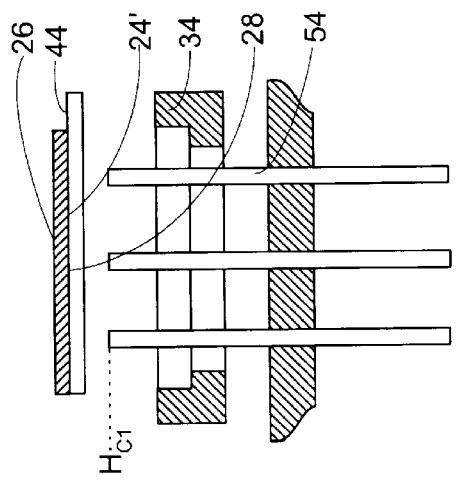

In one implementation, the pins 54 and lifting system 36 continue to proceed downward to the retracted position. Optionally, a brake (not shown) can be provided to hold the lifting system 36 in an intermediate position such as that shown in FIGS. 15 and 16. Use of the brake to hold the lifting system in the intermediate position can reduce the time required to return the pins 54 from the retracted position.

Figure 17:
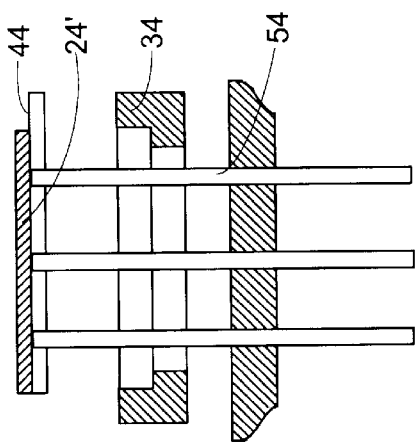
Figure 19:
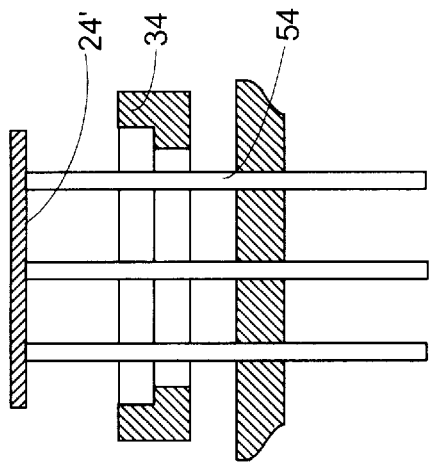
Figure 18:
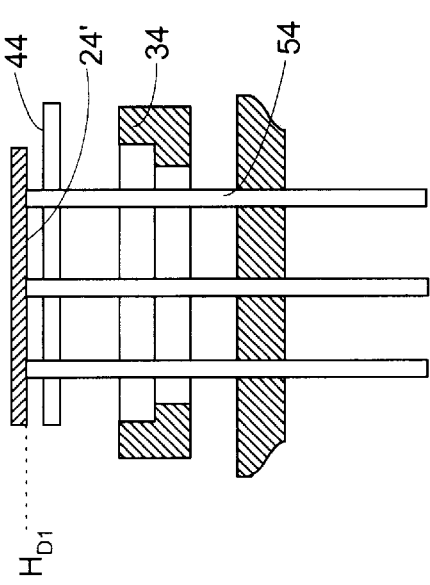

At this point, the end effector 44 carrying a fresh wafer 24' is introduced to the chamber 22 (FIG. 16) in substantially the same position as the wafer 24 in FIG. 14. With the end effector 44 and second wafer 24' in position, a second upstroke is initiated. If the pins 54 have been lowered all the way to the reference height $H_R$, then the lifting system 36 and pins are moved in the up fast mode. Eventually, the pins 54 reach the intermediate height $H_{C1}$ where the aperture 68 permits light to pass between the photoemitter and detector of the upper middle sensor 64C. The transmission of such light produces a signal from the sensor 64C to the control system 100 causing the lifting system 36 to be switched to the up slow mode in a second stage of movement. During the second stage, at the reduced speed, the pins 54 pass through the position shown in FIG. 17 to acquire the substrate 24' from the blade 44. When the pins 54 and lifting system 36 reach the height $H_{D1}$ (FIG. 18), an input signal from the uppermost sensor 64D to the control system 100 causes the control system to withdraw the blade (FIG. 19), and a second downstroke is initiated.

Figure 21:
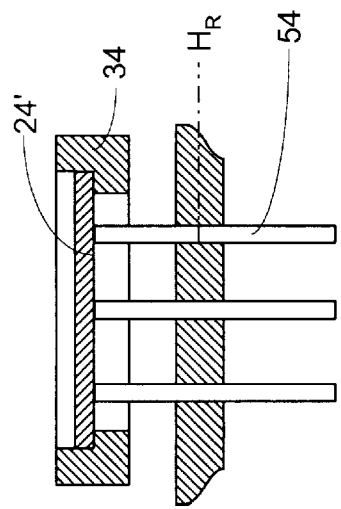
Figure 20:
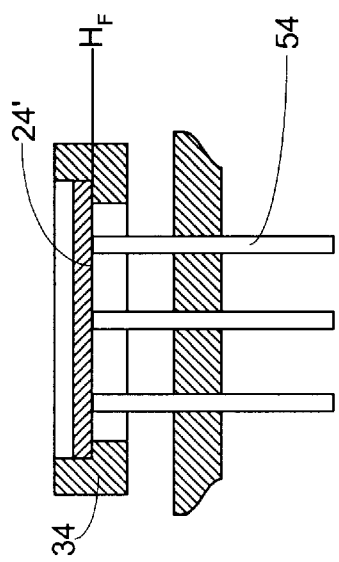

The second downstroke delivers the fresh substrate 24' to the edge ring 34 for processing. In a first stage of movement, the lifting system 36 lowers the pins 54 in the down unpowered mode. As with the first downstroke, upon reaching the height $H_{C2}$, an input signal from the upper middle sensor 64C to the control system 100 causes the control system to return the lifting system 36 to the down fast mode in a second stage of movement. Prior to the wafer reaching the edge ring 34, the pins reach the height $HB_2$. At that height, the signal provided by the lower middle sensor 64B to the control system 100 causes the control system to return the lifting system 36 to the down slow mode in a third stage of movement. During this third stage of movement, the pins 54 pass through the position shown in FIG. 20 at the reduced speed to deposit the wafer 24' onto the edge ring 34 at height $H_F$. When the pins descend to the height $H_{B1}$, termination of the signal provided by the sensor 64B to the control system 100 causes the control system to return the lifting system 36 to the down fast mode and also causes the control system to initiate rotation of the edge ring 34. At the conclusion of this stage of movement, the pins reach the retracted position at the zero height $H_R$ (FIG. 21) and processing of the wafer is commenced. At the end of processing, rotation of the edge ring is stopped, and the wafer 24' can be exchanged for yet another wafer by repetition of the process described above.

In other implementations, the pneumatic slide and associated pneumatic hardware can be replaced by one or more position transducers for raising and lowering the pins. A single position transducer can be provided to lift all the lift pins or an individual position transducer can be associated with each lift pin. The position transducers may be used to provide a more precise control over motion of the lift pins than does the pneumatic system. Use of position transducers can eliminate the need for a brake to hold the lift pins in a waiting position just below the height of the transfer element while one substrate is being removed from the chamber and replaced with another.

Figure 22:
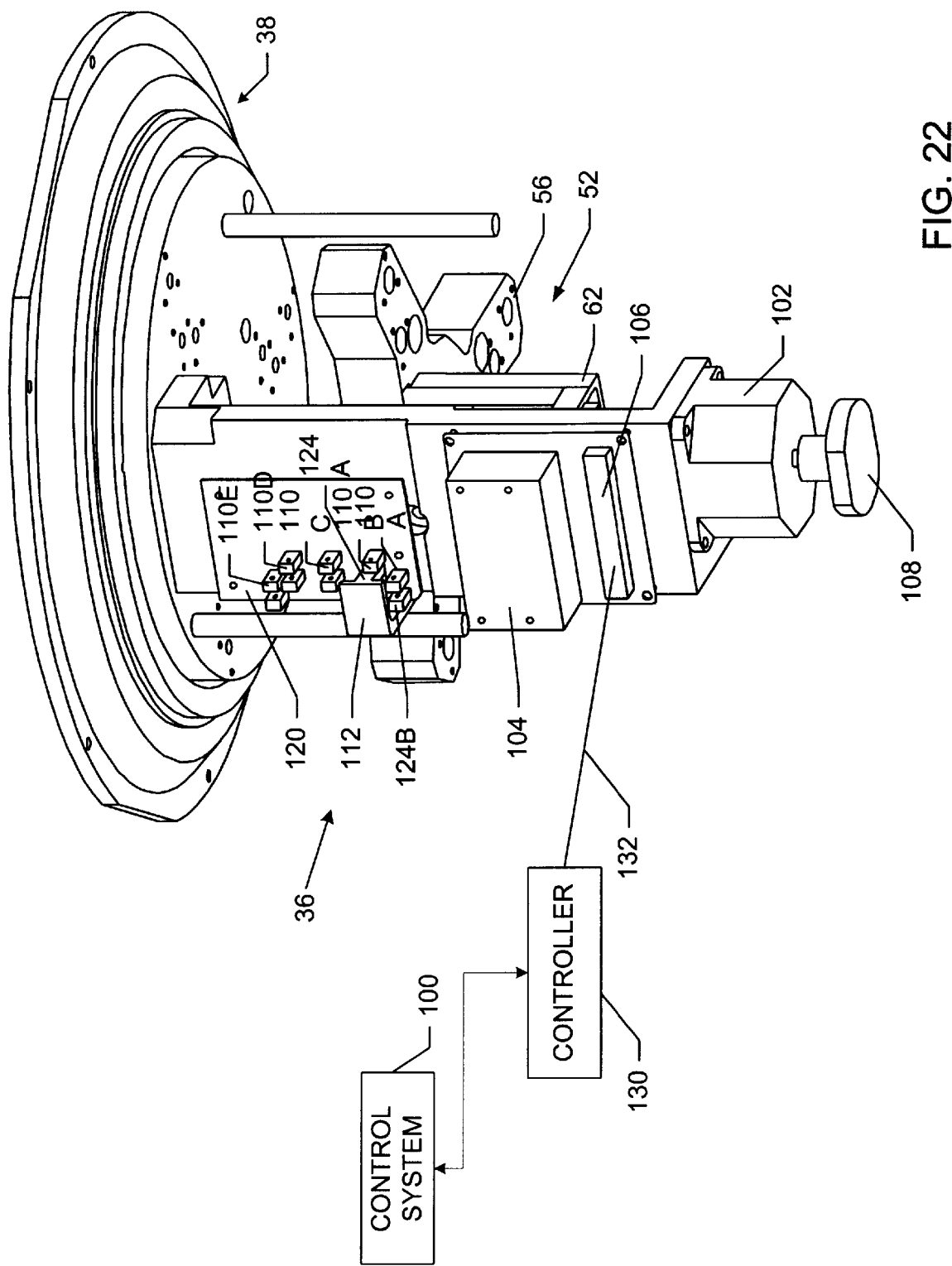
FIGS. 22–23 are schematic illustrations of a substrate lift system incorporating a motorized lead screw according to the system.
Figure 23:
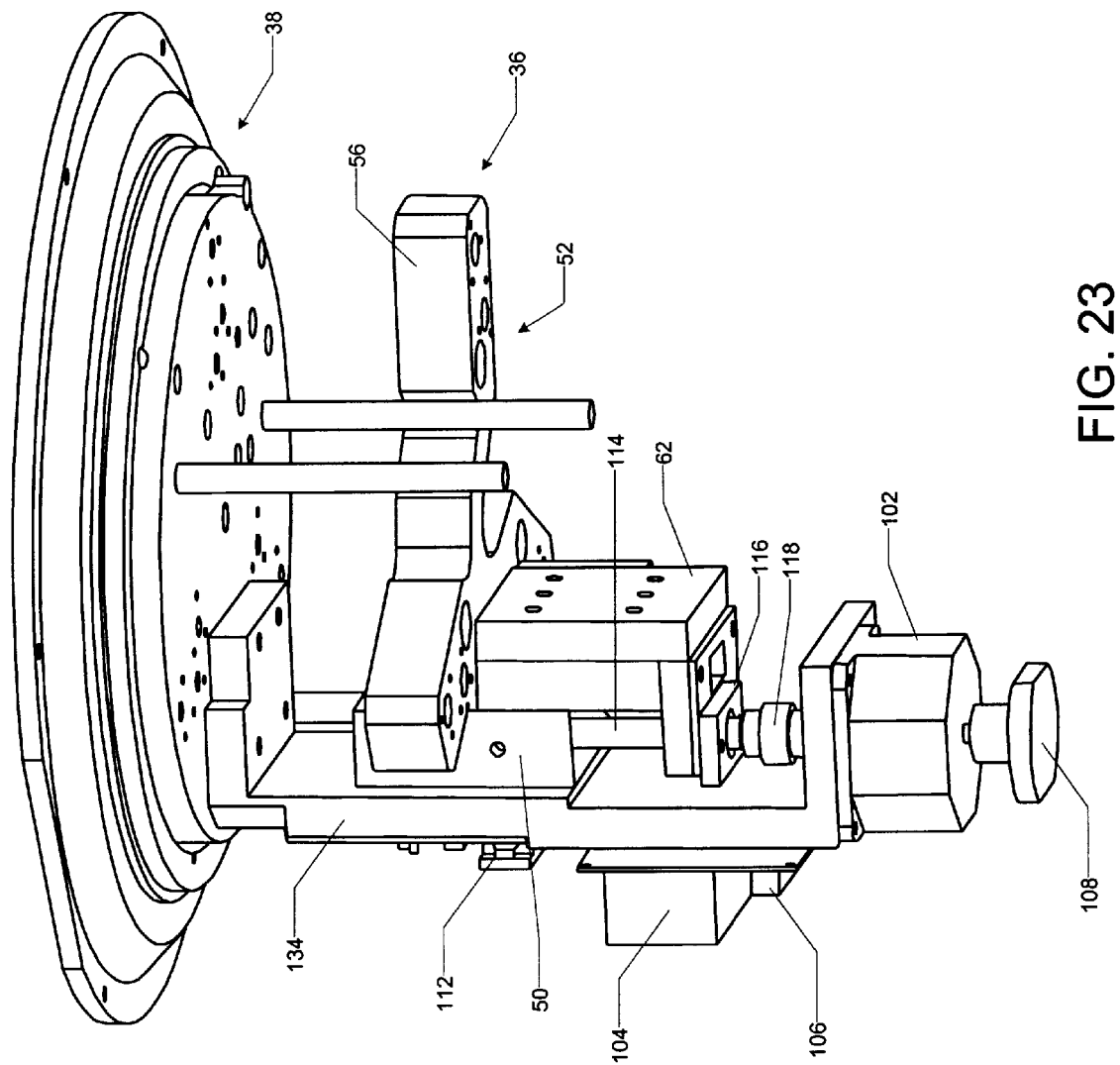

In an alternative embodiment illustrated in FIGS. 22–23, a motorized lead screw 114 can be used to drive the wafer lifting system 36 instead of the pneumatic system described above. The lead screw or other threaded rod 114 is inserted through a hole in the slide 62 and is driven by a stepper motor 102 with its own programmable driver 104. The lead screw 114 is attached to the motor 102 by a flexible coupling 118 which can include torsion springs to improve alignment. A threaded nut 116, which is attached to the slide 62, is disposed about the lead screw 114. A controller 130, which is coupled to the control system 100, can be connected by a cable 132 to a terminal strip 106 to control movement of the motor 102. Depending on the direction of rotation of the motor 102, the lead screw 114 moves either upward or downward so as to move the lift pins 54 (not shown in FIGS. 22–23) vertically up or down. The control system 130, thus, controls the speed of the motor 102 to control the movement of the pins 54.

Although the lift pins 54 are not shown in the motorized lead screw embodiment of FIGS. 22–23, the pins are movably inserted and extend through the elevator or "spider plate" 56 in the same manner as described above with respect to FIG. 2.

In one particular embodiment, a PK264M-02B stepper motor, a CSD2120-T stepper driver, and an SC 8800 controller, all of which are manufactured by Oriental Motors Co. of Japan, can be used as the motor 102, the driver 104 and the controller 130, respectively. In the illustrated implementation, each step represents a rotation of 0.9 degrees of the stepper motor 102, and the pins 54 move vertically about 0.2 inches for each complete revolution of the motor, in other words, for every 400 steps. Additionally, an inertia damper 108, such as a metal disk, can be provided below the motor 102 to improve the smoothness of acceleration and deceleration.

A vertically oriented array of sensors 110A, 110B, 110C, 110D and 110E is mounted on a printed circuit board 120 which is attached to the fixed portion 50 by a bracket et 134. Each sensor 110A through 110E includes a photoemitter and a detector for detecting light emitted by the respective photoemitter. In the implementation of FIGS. 22–23, the sensor array is formed as two columns of sensors, with the lowermost sensor 110A and the uppermost sensor 110E offset horizontally somewhat from the other sensors 110B, 110C and 110D.

A shutter or plate 112 with two vanes 124A, 124B is fixed to the movable portion 52 so that one or the other of the vanes can be positioned between the photoemitter and the detector of each sensor 110A through 110E as the movable portion moves vertically up or down. The vanes 124A, 124B can prevent the transmission of light between the photoemitter-detector pairs of the sensors 110A through 112E. Signals from the sensors 110A through 110E are provided to the controller 130 and/or the control system 100 to determine or confirm the vertical position of the pins 54. Specifically, outputs from the sensors 110A, 110C and 110E are coupled to the controller 130, and outputs from the sensors 110B, 110C, and 110D are coupled to the control system 100.

Figure 27:
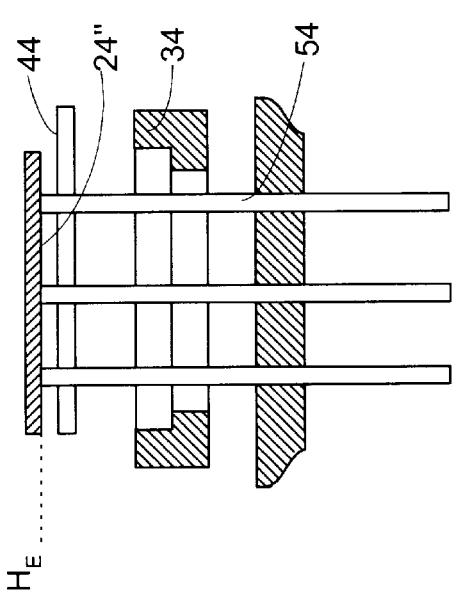
Figure 30:
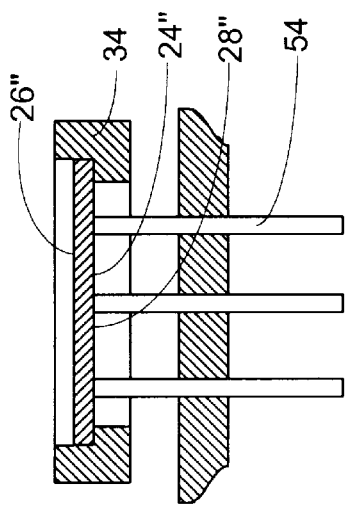

Occlusion of the sensor 110C represents a "home" position in which the pins extend above the edge ring 34 to a reference height $H_H$ (see, e.g., FIG. 24). Occlusion of the sensor 110B indicates that the pins 54 are in their fully retracted position within the holes 58 in the chamber bottom (see, e.g., FIG. 30). In the fully retracted position, the pins 54 are at a height $H_R$. Similarly, occlusion of the sensor 110D indicates that the pins 54 are in their fully extended position above the blade 44 of the robot 42 (see, e.g., FIG. 27). In the fully extended position, the pins 54 are at a height $H_E$. In the implementation of FIGS. 22–23, the distance between the sensors 110B and 110C is approximately 2,700 steps, in other words, about 1.35 inches. Similarly, the distance between the sensors 110C and 110D is approximately 2,100 steps, or about 1.05 inches.

The lowermost and uppermost sensors 110A and 110E can be used to limit movement of the motor 102 in the clockwise and counter-clockwise directions. The sensors 110A and 110E, therefore, can be used as a safety feature to prevent damage to the motor 102. The sensors 110A and 110E also can be used to allow the system to find the "home" position more quickly when the system is turned on in the event that the motor 102 initially is rotated in the wrong direction.

In general, the motor 102 is controlled to raise or lower the lift pins 54 at varying velocities to optimize the throughput of the chamber 22 without damaging the wafers. In a first mode, the pins 54 are moved upward at a velocity in a first upward velocity range. In the illustrated implementation, the first upward velocity range is between about 4,000 and about 8,000 steps per second, in other words, about 2.0 inches to about 4.0 inches per second. In a second mode, the pins are moved upward at a velocity in a second upward velocity range. In the illustrated implementation, the second upward velocity range is between about 500 and about 1,000 steps per second, in other words, about 0.25 inches to about 0.5 inches per second. Thus, in the illustrated implementation, the first upward velocity is at least about four times at great as the second upward velocity.

In a third mode, the pins 54 are moved downward at a velocity in a first downward velocity range. In the illustrated implementation, the first downward velocity range is between about 4,000 and about 8,000 steps per second, in other words, about 2.0 inches to about 4.0 inches per second. In a fourth mode, the pins are moved downward at a velocity in a second downward velocity range. In the illustrated implementation, the second downward velocity range is between about 500 and about 1,000 steps per second, in other words, about 0.25 inches to about 0.5 inches per second. Thus, in the illustrated implementation, the first downward velocity is at least about four times at great as the second downward velocity.

The slower second and fourth modes can be used, for example, just prior to transferring a wafer to or from either the robot blade 44 or the edge ring 34. Slowing the pins 54 at such critical times can help prevent damage to the wafer. Similarly, the second mode can be used just prior to reaching the fully extended height $H_H$ to prevent the wafer from bouncing as movement of the pins 54 is stopped. The faster first and third modes can be used at other times to increase the throughput of the chamber 22.

Referring to FIGS. 24–35, operation of the motorized lead screw embodiment of the wafer lifting system 36 is explained. When power is provided to the controller 130, the controller moves the pins 54 to their "home" position so that the upper tips of the pins are at the height $H_H$ (FIG. 24). As indicated previously, the output of the sensor 110C is used to determine when the pins 54 are in the "home" position. In one implementation, once the pins 54 reach the "home" position, the motor 102 is controlled to move the pins downward an additional predetermined number of steps, for example, 200 steps. The robot blade 44 supporting a substrate or wafer 24" to be processed then is inserted into the chamber 22 (FIG. 25). The wafer 24" has an upper surface 26" and a lower surface 28".

Figure 28:
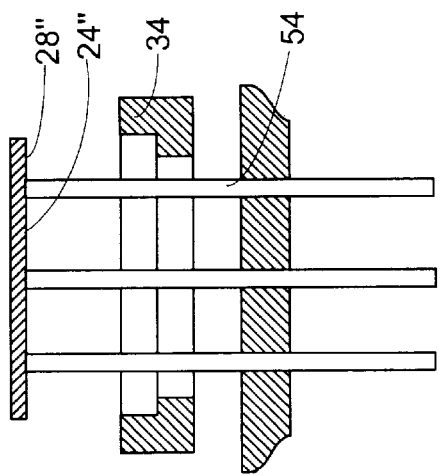
Figure 29:
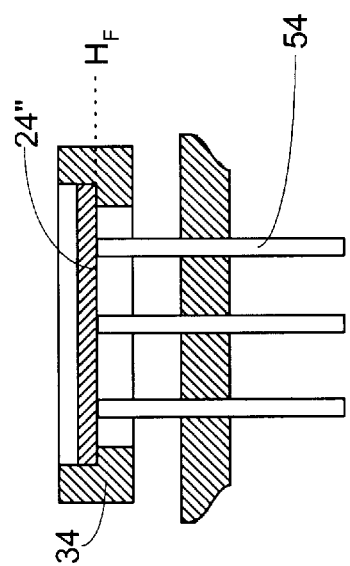

The controller 130 causes the motor 102 to rotate at a velocity in the first upward velocity range so as to move the pins 54 toward the wafer 24" supported by the robot blade 44. In the illustrated embodiment, the motor 102 is rotated at about 6,000 steps per second so that the pins 54 move upward at about 3.0 inches per second. As the pins 54 near the lower surface 28" of the wafer 24", the motor is momentarily stopped. The controller 130 then causes the motor 102 to rotate at a velocity in the second upward velocity range so that the pins 54 contact the underside of the wafer 24" at a lower velocity. In the illustrated embodiment, the motor is rotated at about 1,000 steps per second so that the pins 54 contact the underside of the wafer 24" at a speed of about 0.5 inched per second (FIG. 26). The motor 102 then is accelerated until it rotates at a velocity in the second upward range, for example, about 4,000 steps per second, to move the pins 54 supporting the wafer 24" upward at a speed of about 2.0 inches per second. As the pins 54 approach their fully extended height $H_E$ above the robot blade 44, the motor 102 is slowed to a velocity in the second upward range, for example, about 500 steps per second, to move the wafer 24" upward at about 0.25 inched per second. When the controller 130 determines that the pins 54 have reached the extended height $H_E$ (FIG. 27) based on the number of steps the motor 102 has rotated, the motor is stopped. The controller 130 then checks the output of the sensor 110D to confirm that the pins 54 are, in fact, in the fully extended position. The robot blade 44 is removed from the chamber (FIG. 28).

Next, the controller 130 causes the motor 102 to move the pins 54 supporting the wafer 24" downward toward the edge ring 34. Initially, the motor rotates slowly, for example, at a speed of about 500 steps per second, to move the pins downward at a velocity of about 0.25 inches per second. The rotation of the motor 102 then is accelerated to a velocity in the first downward range, for example, about 6,000 steps per second to lower the pins 54 and the wafer 24" at about 3.0 inches per second. As the lower surface 28" of the wafer 24" approaches the edge ring 34, the speed of the motor 102 is slowed to a velocity in the second downward range, for example, about 1,000 steps per second. The wafer 24" is, therefore, transferred to the edge ring 34 (FIG. 29) as the lift pins 54 move at about 0.5 inches per second.

Once the wafer 24" is transferred to the edge ring 34, the motor 102 is controlled to rotate at a velocity in the first downward range, for example, about 8,000 steps per second, to lower the pins 54 to their fully retracted position $H_R$ (FIG. 30) at a speed of about 4.0 inches per second. The motor 102 is stopped, and the position of the lift pins 54 within the holes 58 in the chamber bottom is confirmed by checking the output of the sensor 110B. The wafer 24" then can be processed.

Figure 31:
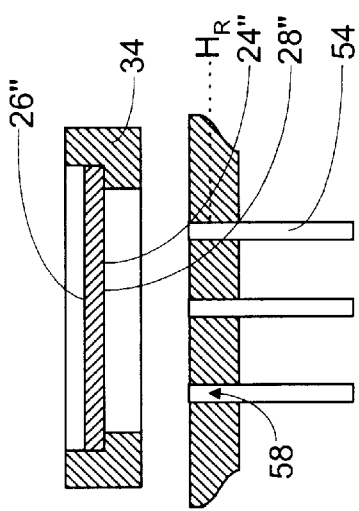
Figure 32:
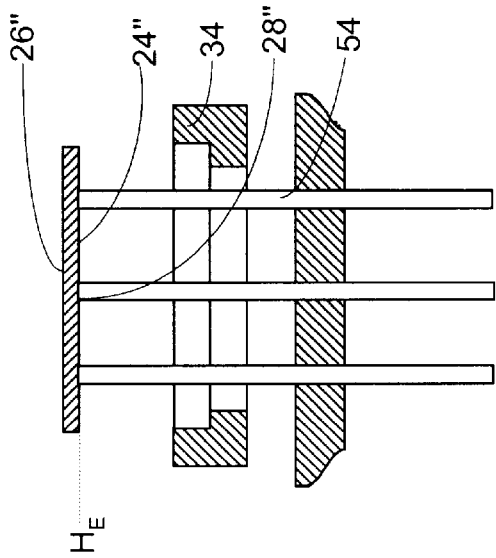
Figure 33:
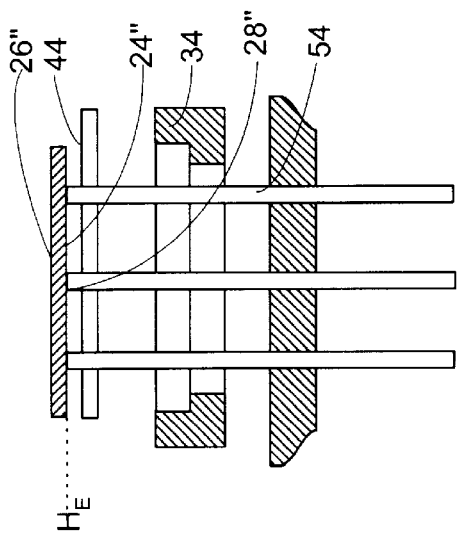

Following processing of the wafer 24", the motor 102 is controlled to rotate at a velocity in the first upward range, for example, about 7,000 steps per second, to raise the pins 54 toward the wafer supported by the edge ring 34 at about 3.5 inches per second. As the pins 54 approach the edge ring 34, the motor 102 is slowed to a speed in the second upward range, for example, about 1,000 steps per second, to raise the pins into engagement with the lower surface 28" of the wafer 24" (FIG. 31). The motor 102 is stopped momentarily. Next, the motor 102 is accelerated to rotate initially at about 500 steps per second and then to a speed in the first upward range, for example, about 5,000 steps per second, to raise the pins 54 and the processed wafer 24" toward the fully extended position $H_E$ at a speed of about 2.5 inches per second. As the lift pins 54 approach the fully extended position $H_E$ the motor 102 is decelerated to a velocity in the second upward range, for example, about 500 steps per second, to raise the pins to the position $H_E$ (FIG. 32) at a speed of about 0.25 inches per second. The motor 102 then is stopped, and the controller 130 verifies the position of the pins 54 by checking the output of the sensor 110D. Next, the robot blade 44 is inserted into the chamber below the processed wafer 24" supported by the lift pins 54 (FIG. 33).

Figure 34:
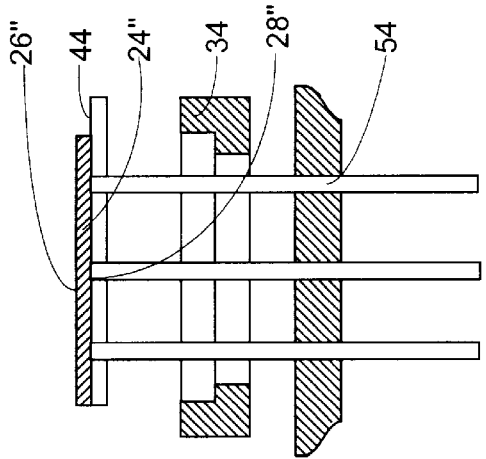

With the robot blade 44 positioned below the raised pins 54, the controller 130 accelerates the motor 102 to lower the pins 54 and the processed wafer 24". Initially, the motor 102 is rotated at a speed of about 500 steps per second. Subsequently, the motor 102 is rotated at a speed in the first downward range, for example, about 5,000 steps per second to lower the processed wafer 24" toward the robot blade 44 at a speed of about 2.5 inches per second. As the lower surface 28" of the wafer 24" approaches the robot blade 44, the motor 102 is slowed to a speed in the second downward range, for example, about 1,000 steps per second, to transfer the processed wafer 24" to the blade 44 at a speed of about 0.5 inches per second (FIG. 34).

Figure 35:
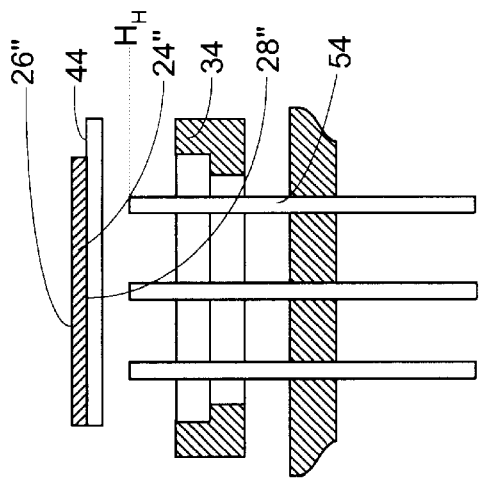

Once the processed wafer 24" is transferred to the robot blade 44, the motor 102 is momentarily stopped. The controller 130 then causes the motor 102 to rotate at a speed in the first downward velocity range, for example, about 7,000 steps per second, to lower the lift pins 54 to their "home" position at a height $H_H$ (FIG. 35). The controller 130 confirms that the pins 54 are in the "home" position by checking the output of the sensor 110C. With the pins 54 in the "home" position, the processed wafer 24" supported by the robot blade 44 can be removed from the chamber. A new wafer to be processed then can be brought into the chamber and the cycle begun again.

As described above, the stepper motor 102 allows the acceleration and deceleration of the lead screw 114 to be controlled precisely so as to obtain a highly repeatable technique for controlling movement of the lift pins 54. In this manner, movement of a wafer in the process chamber 22 can be optimized to increase the throughput of the chamber, reduce the likelihood of damage to the wafer, and reduce bouncing of the wafer while supported by the lift pins 54.

Some of the details of the foregoing embodiments are particularly suited for particular processing chambers, such as the RTP Centura XE™, manufactured by Applied Materials, Inc. Different dimensions and pin speeds may be suitable for other substrate processing systems and chambers.

Other implementations are within the scope of the following claims.

What is claimed is:

1. An apparatus for processing substrates comprising:
    a chamber having a bottom;
    a substrate transfer element for transferring a substrate to and from the chamber;
    a substrate support for receiving and holding a substrate within the chamber;
    a plurality of pins positioned and configured to be received by respective holes in the chamber bottom and moveable between a retracted position and an extended position; and
    a pin actuation system for moving the pins between the retracted position and the extended position and configured to bring the pins into engagement with a substrate held by the substrate support by (1) raising the pins from below the substrate at a velocity in a first upward velocity range and (2) then slowing the pins to a velocity in a second upward velocity range so that the pins contact a lower surface of the substrate while travelling at a velocity in the second upward velocity range, wherein the second upward velocity range is less than the first upward velocity range.

2. The apparatus of claim 1 wherein the pin actuation system is further configured to raise the substrate out of engagement with the substrate support to a height at which the substrate transfer element can be positioned beneath the substrate, by (1) raising the pins at a velocity in the first upward velocity range while the pins support the substrate; (2) subsequently slowing the velocity of the pins to a velocity in the second upward velocity range; and (3) bringing the pins to a stop at the height at which the substrate transfer element can be positioned beneath the substrate.

3. An apparatus for processing substrates comprising:
    a chamber having a bottom;
    a substrate transfer element for transferring a substrate to and from the chamber;
    a substrate support for receiving and holding a substrate within the chamber;
    a plurality of pins positioned and configured to be received by respective holes in the chamber bottom and moveable between a retracted position and an extended position; and a pin actuation system configured to transfer a substrate from the pins in their extended position to the substrate support by (1) lowering the pins at a velocity in a first downward velocity range, and (2) subsequently lowering the pins at a velocity in a second downward velocity range so that a lower surface of the substrate contacts the substrate support while travelling at the velocity in the second downward velocity range, wherein the second downward velocity range is less than the first downward velocity range.

4. The apparatus of claim 3 wherein the pin actuation system is further configured to lower the pins to the retracted position after the substrate has been transferred to the substrate support, wherein the pins are lowered to the retracted position at a velocity in the first downward velocity range.

5. The apparatus of claim 4 wherein the pin actuation system is further configured to cause the pins to acquire the substrate from the substrate transfer element by (1) raising the pins from a height beneath the substrate transfer element at a velocity in a first upward velocity range, and (2) then slowing the pins to a velocity in a second upward velocity range so that the pins contact the lower surface of the substrate while travelling at a velocity in the second upward velocity range, wherein the second upward velocity range is less than the first upward velocity range.

6. The apparatus of claim 5 wherein the pin actuation system is further configured to raise the substrate out of engagement with the substrate transfer element to a height at which the substrate transfer element can be withdrawn from beneath the substrate.

7. The apparatus of any of claims 1, 2, 3, 4, 5 and 6, wherein the pin actuation system is pneumatically-controlled.

8. The apparatus of claim 7 wherein the pin actuation system includes:
a pneumatic cylinder having a piston vertically moveable within the cylinder and separating the cylinder into an upper cylinder chamber and a lower cylinder chamber;
a pneumatic source; and
a plurality of valves to establish selective communication between the upper and lower cylinder chambers, the pneumatic source and atmosphere.

9. The apparatus of claim 8 further including:
an array of sensors each of which has an optical source and an associated optical detector for receiving light signals from its associated optical source;
a movable plate which, depending on its position, can obstruct transmission of light signals from the optical sources to their respective detectors, and wherein output signals from the optical detectors are indicative of a vertical position of the pins; and
a controller coupled to the sensors so as to receive the output signals from the optical detectors and to control the velocity of the pins based on the received output signals.

10. The apparatus of any of claims 1, 2, 3, 4, 5 and 6, wherein the pin actuation system includes:
a threaded rod;
a stepper motor for driving the threaded rod; and
a controller to control movement of the stepper motor.

11. The apparatus of claim 10 further including:
an array of sensors each of which has an optical source and an associated optical detector for receiving light signals from its associated optical source;
a movable plate which, depending on its position, can obstruct transmission of light signals from the optical sources to their respective detectors, and wherein output signals from the optical detectors are indicative of a vertical position of the pins; and
a controller coupled to the sensors so as to receive the output signals from the optical detectors and to confirm a position of the pins based on the received output signals.

12. The apparatus of any one of claims 1, 2, and 5 wherein the velocities of the first upward velocity range are each at least about four times greater than the velocities of the second upward velocity range.

13. The apparatus of any one of claims 3, 4, and 5 wherein the velocities of the first downward velocity range are each at least about four times greater than the velocities of the second downward velocity range.

14. A method of processing a substrate positioned on a substrate support for receiving and holding the substrate within a chamber, the method comprising:
raising a plurality of pins, by use of a pin actuation system, from below the substrate positioned on the substrate support at a velocity in a first upward velocity range; and
then slowing the pins, by use of the pin actuation system, to a velocity in a second upward velocity range so that the pins contact a lower surface of the substrate while travelling at a velocity in the second upward velocity range, wherein the second upward velocity range is less than the first upward velocity range.

15. The method of claim 14 further including:
raising the pins above the substrate support at a velocity in the first upward velocity range while the pins support the substrate;
subsequently slowing the velocity of the pins to a velocity in the second upward velocity range; and
bringing the pins to a stop at a height at which a substrate transfer element for transferring substrates to and from the chamber can be positioned beneath the substrate.

16. The method of claim 15 further including:
positioning the substrate transfer element beneath the substrate supported by the pins; and
lowering the pins to transfer the substrate to the substrate transfer element.

17. A method of processing a substrate positioned on a substrate transfer element for transferring substrates to and from a chamber, the method comprising:
raising a plurality of pins, by use of a pin actuation system, to lift the substrate from the substrate transfer element to a position above the substrate transfer element;
withdrawing the substrate transfer element out of a path of the pins;
lowering the pins, by use of the pin actuation system, at a velocity in a first downward velocity range; and
subsequently lowering the pins, by use of the pin actuation system, at a velocity in a second downward velocity range so that a lower surface of the substrate contacts a substrate support in the chamber while travelling at the velocity in the second downward velocity range, wherein the second downward velocity range is less than the first downward velocity range.

18. The method of claim 17 further including:
lowering the pins to a retracted position after the substrate has been transferred to the substrate support, wherein the pins are lowered to the retracted position at a velocity in the first downward velocity range.

19. The method of claim 17 wherein raising the plurality of pins to lift the substrate from the substrate transfer element to a position above the substrate transfer element includes:

raising the pins from a height beneath the substrate transfer element at a velocity in a first upward velocity range; and then slowing the pins to a velocity in a second upward velocity range so that the pins contact the lower surface of the first substrate while travelling at the velocity in the second upward velocity range, wherein the second upward velocity range is less than the first upward velocity range.

20. The method of claim 19 wherein raising the plurality of pins to lift the substrate from the substrate transfer element to a position above the substrate transfer element further includes:

raising the pins with the substrate supported thereon to a height at which the substrate transfer element can be withdrawn from beneath the substrate at a velocity in the second upward velocity range.

21. The method of any one of claims 14, 15, 19, and 20 wherein the velocities of the first upward velocity range are each at least about four times greater than the velocities of the second upward velocity range.

22. The method of any one of claims 17, 18, 19, and 20 wherein the velocities of the first downward velocity range are each at least about four times greater than the velocities of the second downward velocity range.

23. The method of claim 19 or 20, wherein the velocities of the first upward velocity range are each at least about four times greater than the velocities of the second upward velocity range, and wherein the velocities of the first downward velocity range are each at least about four times greater than the velocities of the second downward velocity range.

* * * * *